US009058985B2

(12) United States Patent
Kim et al.

(10) Patent No.: US 9,058,985 B2
(45) Date of Patent: Jun. 16, 2015

(54) METHOD OF MANUFACTURING GRAPHENE LAMINATED STRUCTURE, GRAPHENE LAMINATED STRUCTURE, AND ELECTRONIC DEVICE INCLUDING THE GRAPHENE LAMINATED STRUCTURE

(71) Applicant: Samsung Electronics Co., Ltd., Suwon-Si, Gyeonggi-Do (KR)

(72) Inventors: Sang-woo Kim, Seoul (KR); Sang-a Han, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/070,999

(22) Filed: Nov. 4, 2013

(65) Prior Publication Data
US 2014/0239256 A1   Aug. 28, 2014

(30) Foreign Application Priority Data
Feb. 22, 2013   (KR) ........................ 10-2013-0019373

(51) Int. Cl.
*H01L 21/02* (2006.01)
*H01L 29/16* (2006.01)
*B82Y 40/00* (2011.01)
*H01L 29/267* (2006.01)
*H01L 29/778* (2006.01)
*C30B 29/02* (2006.01)

(52) U.S. Cl.
CPC ......... *H01L 21/0237* (2013.01); *H01L 29/1606* (2013.01); *B82Y 40/00* (2013.01); *H01L 29/267* (2013.01); *H01L 29/778* (2013.01); *H01L 21/02491* (2013.01); *H01L 21/02527* (2013.01); *H01L 21/0262* (2013.01); *C30B 29/02* (2013.01)

(58) Field of Classification Search
None
See application file for complete search history.

(56) References Cited

U.S. PATENT DOCUMENTS 8,198,707 B2   6/2012   Colombo et al.
2012/0292596 A1*   11/2012   Dabrowski et al. ............. 257/29

FOREIGN PATENT DOCUMENTS

WO   WO-2012-127245 A2 *   9/2012   .............. H01L 29/16

OTHER PUBLICATIONS

Lee, Kang Hyuck et al. "Large-Scale Synthesis of High-Quality Hexagonal Boron Nitride Nanosheets for Large-Area Graphene Electronics" American Chemical Society (2012) vol. 12. pp. 714-718.
Lee, Bongki et al. "Conformal Al2O3 dielectric layer deposited by atomic layer deposition for graphene-based nanoelectronics" Applied Physics Letters (2008) 92, 203102.
Wang, Xinran et al. "Atomic Later Deposition of Metal Oxides on Pristine and Fucntionalized Graphene" American Chemical Society, (2008) vol. 130, No. 26.
Lin, Y.-M, et al. "100 GHz Transistors from Wafer-Scale Epitaxial Graphene" Science (2010) vol. 327.

* cited by examiner

*Primary Examiner* — Johannes P Mondt
(74) *Attorney, Agent, or Firm* — Harness, Dickey & Pierce, P.L.C.

(57) ABSTRACT

A method of manufacturing a graphene laminated structure includes plasma-treating a surface of a hexagonal boron nitride sheet using a fluorine-based gas plasma, depositing the hexagonal boron nitride sheet on a graphene sheet, and forming an insulating layer on a surface of the surface-treated hexagonal boron nitride sheet.

14 Claims, 14 Drawing Sheets

METHOD OF MANUFACTURING GRAPHENE LAMINATED STRUCTURE, GRAPHENE LAMINATED STRUCTURE, AND ELECTRONIC DEVICE INCLUDING THE GRAPHENE LAMINATED STRUCTURE

CROSS-REFERENCE TO RELATED APPLICATIONS

This application claims the benefit of Korean Patent Application No. 10-2013-0019373, filed on 22 Feb. 2013, in the Korean Intellectual Property Office, the disclosure of which is incorporated herein in its entirety by reference.

BACKGROUND

1. Field

Example embodiments relate to methods of manufacturing a graphene laminated structure, graphene laminated structures, and electronic devices including the graphene laminated structures, and in particular, to structures that use a hexagonal boron nitride (h-BN) sheet as a buffer layer or sacrificial layer to form a dielectric, e.g., high-k, insulating layer on graphene and methods of manufacturing the structure.

2. Description of the Related Art

Graphene is a material formed of a carbon single atom layer having a two-dimensional planar structure. Because graphene has desirable mechanical electrical characteristics, graphene is attractive as a high-performance electronic material.

For graphene to be used in an electronic device, e.g., LED, a top gate transistor is needed. To manufacture a top gate transistor that uses graphene as a channel, a high-quality insulating material is needed between graphene and a top gate. A dielectric material with a high-k constant (e.g., $Al_2O_3$ or $HfO_2$) may be used. However, when these materials are directly deposited on graphene, due to the $sp^2$ structure of graphene, the deposition may not be desirable and also, graphene may be adversely affected.

Accordingly, methods of depositing a high-k material on graphene without damage on the surface of graphene are being studied.

SUMMARY

Example embodiments provide methods of manufacturing a graphene laminated structure which enable formation of a high-k insulating layer without any damage on the surface of graphene.

Example embodiments also provide graphene laminated structures manufactured by using the methods. Example embodiments also provide electronic devices including the graphene laminated structures. Example embodiments also provide transistors including the graphene laminated structures.

According to example embodiments, a method of manufacturing a graphene laminated structure includes plasma-treating a surface of a hexagonal boron nitride sheet using fluorine-based gas plasma, depositing the hexagonal boron nitride sheet on a graphene sheet, and forming an insulating layer on a surface of the surface-treated hexagonal boron nitride sheet.

In example embodiments, the fluorine-based gas plasma may be a gas plasma that does not damage the surface of the hexagonal boron nitride sheet, and may be, for example, at least one gas selected from $CF_4$, $CHF_3$, $SF_6$, and $NF_3$.

In example embodiments, the plasma-treating may be performed at a flow rate of about 1 to about 10 sccm and at a plasma surface treatment pressure of about 300 to about 700 mTorr for about 1 to about 10 seconds.

In example embodiments, the hexagonal boron nitride sheet may have a two-dimensional planar structure including a B—N bond that is a $sp^2$ covalent bond and an interlayer bond that is a Van Der Waals bond, and the hexagonal boron nitride sheet may have a thickness of 10 nm or less.

In example embodiments, an area of the hexagonal boron nitride sheet to be plasma-treated may be about 1 $cm^2$ or more.

In example embodiments, the method may further include providing the hexagonal boron nitride sheet on a metal catalyst thin film before the plasma-treating.

In example embodiments, the method may further include removing the metal catalyst thin film from the hexagonal boron nitride sheet by etching after the plasma-treating.

In example embodiments, the graphene sheet may be one of a single layer of a polycyclic aromatic sheet including a plurality of carbon atoms connected to each other via a covalent bond and arranged on a plane and a multi-layer formed by stacking a plurality of the polycyclic aromatic sheets, and the graphene sheet may have a thickness of about 30 nm or less.

In example embodiments, an area of the graphene sheet may be about 1 $cm^2$ or more.

In example embodiments, the graphene sheet may be provided on at least one substrate before the depositing, and the substrate may include at least one of a Si substrate, a SiC substrate, a glass substrate, a GaN substrate, a silica substrate, a sapphire substrate, a metal substrate, and a carbon substrate.

In example embodiments, the insulating layer may include a high-k dielectric material having a dielectric constant of 7 or more.

In example embodiments, the insulating layer may include at least one of a metal oxide, a metal nitride, a polymer, and an organic molecule.

In example embodiments, the insulating layer may include at least one of a silicon oxide and a silicon nitride.

In example embodiments the insulating layer may include at least one of a silicon oxide, an aluminum oxide, a tantalum oxide, a titanium oxide, a tin oxide, a vanadium oxide, a barium strontium titanate, a barium zirconate titanate, a lead zirconate titanate, a lead lanthanum titanate, a strontium titanate, a barium titanate, a barium magnesium fluoride, a lanthanum oxide, a fluorine oxide, a magnesium oxide, a bismuth oxide, a bismuth titanate, a niobium oxide, a strontium bismuth titanate, a strontium bismuth tantalate, a tantalum pentoxide, a bismuth tantalite niobumate, and a yttrium oxide.

In example embodiments, the insulating layer may be formed by at least one of atomic layer deposition, vacuum deposition, molecular-ray epitaxial growth, ion cluster beaming, low-energy ion-beaming, ion plating, chemical vapor deposition (CVD), sputtering, atmospheric plasma method, spray-coating, spin coating, blade coating, dip coating, casting, roll coating, bar coating, and die coating.

According to example embodiments, a graphene laminated structure includes a channel layer on a substrate, the channel layer including a graphene sheet, a buffer layer on the channel layer, the buffer layer including a hexagonal boron nitride sheet, and an insulating layer on the buffer layer.

According to example embodiments, an electronic device includes the graphene laminated structure.

BRIEF DESCRIPTION OF THE DRAWINGS

These and/or other aspects will become apparent and more readily appreciated from the following description of the embodiments, taken in conjunction with the accompanying drawings of which:

FIG. 5A shows data of an in-plane vibration region showing a stretching vibration mode of boron and nitrogen of the h-BN, and FIG. 5B shows data of an out-of-plane vibration region showing a B—N—B bending vibration mode;

DETAILED DESCRIPTION

Figure 1:
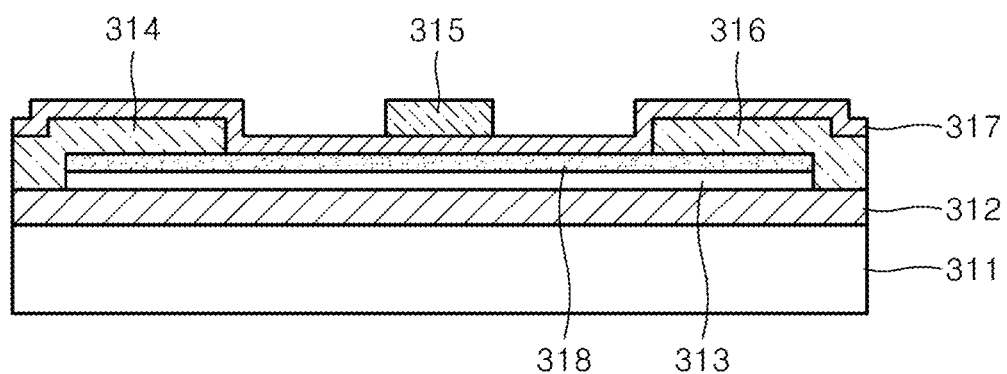
FIG. 1 is a schematic view of a field effect transistor (FET) according to example embodiments.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element or layer is referred to as being of elements, modify the entire list of elements and do not modify the individual elements ected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Spatially relative terms, such as gh the terms first, second, third, etc. may be used herein to describe various elements, components, regions, layers and/or sections, these elements, components, regions, layers and/ore(s) as illustrated in the figures. It will be understood that the spatially relative terms are intended to encompass different orientations of the device in use or operation in addition to the orientation depicted in the figures. For example, if the device in the figures is turned over, elements described as ms, such as gh the terms first, second, third, etc. may be used herein to describe various elements, components, regions, layers and/or sections, these elements, components, regions, layers and/ore(s) device may be otherwise oriented (rotated 90 degrees or at other orientations) and the spatially relative descriptors used herein interpreted accordingly.

The terminology used herein is for the purpose of describing particular example embodiments only and is not intended to be limiting of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some example embodiments will be explained in detail with reference to the accompanying drawings.

A method of manufacturing a graphene laminated structure according to example embodiments includes plasma-treating a surface of a hexagonal boron nitride sheet by using fluorine-based gas plasma, depositing the hexagonal boron nitride sheet on a graphene sheet, and forming an insulating layer on a surface of the surface-treated hexagonal boron nitride sheet.

According to the method of manufacturing a graphene laminated structure, a hexagonal boron nitride sheet that is surface-modified by using fluorine-based gas plasma may be transferred onto a graphene sheet for use as a buffer layer (or protective layer) or a sacrificial layer for the deposition of a high-k insulating layer thereon.

When a dielectric, for example, high-k material, e.g., $Al_2O_3$, is deposited directly on graphene by using, for example, atomic layer deposition (ALD), the dielectric, for example, high-k material may not be uniformly formed on graphene and also, may damage graphene. On the other hand, according to the method of manufacturing a graphene laminated structure, a hexagonal boron nitride sheet may be plasma-treated to activate a surface thereof, and the result may be used as a buffer layer for the deposition of a dielectric, for example, high-k material, so that a dielectric, for example, high-k material layer may be formed thereon without any damage to a graphene sheet.

The hexagonal boron nitride (h-BN) sheet may have a two-dimensional planar structure in which a B—N bond is a $sp_2$ covalent bond and an interlayer bond is a Van Der Waals bond, and has a thickness of 10 nm or less, for example, 5 nm or lower.

According to example embodiments, the hexagonal boron nitride (h-BN) sheet may be provided on a first substrate. In this regard, the first substrate is an etchable substrate, and for example, may be an inorganic substrate, e.g., a metal substrate including Ni, Cu, or W, a Si substrate, a SiC substrate, a glass substrate, a GaN substrate, a silica substrate, or a sapphire substrate, or a carbon substrate, e.g., a graphite substrate.

The hexagonal boron nitride (h-BN) sheet may be formed by, for example, chemical vapor deposition (CVD). For example, the h-BN sheet may be formed by supplying a nitrogen source and a boron source in the form of vapor in the presence of a metal catalyst in a reactor to grow h-BN, thereby obtaining a large-area h-BN sheet.

As a catalyst metal for use in forming an h-BN sheet, any one of various materials that are used in depositing boron nitride may be used without limitations. For example, at least one metal selected from the group consisting of nickel (Ni), cobalt (Co), iron (Fe), platinum (Pt), palladium (Pd), gold (Au), aluminum (Al), chromium (Cr), copper (Cu), magnesium (Mg), manganese (Mn), molybdenum (Mo), rhodium (Rh), silicon (Si), thallium (Ta), titanium (Ti), tungsten (W), uranium (U), vanadium (V), and zirconium (Zr), or an alloy thereof may be used, and the catalyst metal may have a thickness of about 1 mm or less, for example, a thickness of about 500 μm to about 10 μm.

The size of the catalyst metal may determine the size of a h-BN sheet that grows thereon, and a large-area h-BN sheet may be obtained by controlling the size of the catalyst metal. For example, the size of the catalyst metal, that is, at least one of a width and a length thereof may be about 1 mm or more, about 1 m or more, or even about 10 m or more.

When the catalyst metal is in the form of a film, the catalyst metal may be independently used, and if needed, a catalyst metal on a substrate may be used. In particular, when a film-type metal catalyst is used, a substrate may be used for convenience of manufacturing processes. Examples of such a substrate are an inorganic substrate, e.g., a metal substrate including Ni, Cu, or W, a Si substrate, a SiC substrate, a glass substrate, a GaN substrate, a silica substrate, or a sapphire substrate, and a carbon substrate, e.g., a graphite substrate.

The shape of the catalyst metal may determine the shape of an h-BN sheet formed thereon. For example, when the catalyst metal is formed in a pattern, an h-BN sheet formed thereon may also have the same pattern.

A high-quality and large-area h-BN sheet may be formed by performing a heat treatment while a nitrogen source and a boron source are supplied in a vapor form in the presence of a catalyst metal into a reactor. The vaporous nitrogen source and boron source may be supplied at a constant flow rate, in an inert atmosphere and/or a reducing atmosphere. The inert atmosphere may be provided by using inert gas, e.g., argon gas or helium gas, and the reducing atmosphere may be provided by using hydrogen gas. When the inert gas and the hydrogen gas are supplied together in a mixed gas form, inert gas may occupy about 60 to 95 vol % of the entire chamber, and hydrogen gas may occupy about 5 to 40 vol % of the entire chamber.

The vapor sources and at least one of inert gas and the hydrogen gas may be provided at a flow rate, for example, about 10 to about 10,000 sccm, and for example, a vaporous nitrogen source and a vaporous boron source may be supplied at a stoichiometric ratio of 1:1, for example, at a flow rate of about 1 to about 100 sccm.

The nitrogen source may be any one of various sources that provide a nitrogen element in a vapor phase, and may include at least one selected from $NH_3$ and $N_2$.

The boron source may be any one of various sources that provide a boron element in a vapor phase, and may include at least one selected from $BH_3$, $BF_3$, $BCl_3$, $B_2H_6$, $(CH_3CH_2)_3B$, $(CH_3)_3B$, and diboran.

According to example embodiments as a source for supplying both nitrogen and boron, at least one selected from borazine ($H_3NBH_3$) and borazan (($BH)_3(NH)_3$) may be used.

The nitrogen source and the boron source may be provided in a vapor phase into a reactor. However, they are not necessarily in a vapor phase. For example, a solid nitrogen and boron-containing material may be vaporized in an external vessel and then, the vaporized material is used.

In detail, a solid nitrogen and boron-containing compound are contained in an external vessel, and then, it is heated to a predetermined or given temperature to vaporize, for example, sublimate the compound, and then, the result is supplied into a reactor in which the catalyst metal is located.

The vaporous nitrogen source and the vaporous boron source which are obtained by sublimation in the external vessel may be supplied to the reactor together with nitrogen gas. In this regard, the temperature of the external vessel and the flow rate of the nitrogen gas are appropriately controlled to adjust amounts of nitrogen and boron supplied into a chamber. By doing so, growth of h-BN may be controlled.

An example of the solid nitrogen and boron-containing compound stored in the external vessel is an ammonia-boran ($NH_3$—$BH_3$) compound. Because the ammonia-boran compound is vaporized at a temperature of about 130° C., amounts of $NH_3$ and $BH_3$ obtained by evaporation may be appropriate controlled by adjusting the temperature.

To grow h-BN into a two-dimensional sheet having a crystal structure on the surface of the catalyst metal, a heat treatment process is performed. The heat treatment process may be performed at an appropriate temperature for a predetermined or given period of time. For example, the heat treatment process may be performed at about 700° C. to about 1,200° C., or about 700° C. to a melting point of the catalyst metal for about 1 minute to about 2 hours. As a heat source for the heat treatment, induction heating, radiant heat, laser, IR, microwave, plasma, UV, or surface plasmon heating may be used without limitation. Such heat sources may be attached to the chamber to increase the temperature of the inside of the chamber up to a predetermined or given temperature.

The result obtained by the heat treatment process may further undergo a cooling process. The cooling process may help the generated h-BN uniformly grow to be uniformly arranged into a sheet shape, and during the cooling process, the temperature may be decreased at a rate of, for example, about 10 to about 100° C. per minute. For this cooling, at least one of inert gas and hydrogen gas may be supplied at a flow rate. According to example embodiments, a natural cooling may also be used. The natural cooling may be performed by stopping operation of a heat source or removing the heat source from the reactor. The heat treatment process and the cooling process may be performed as one cycle. However, this cycle may be repeatedly performed to form an h-BN structure having more layers and higher density. For example, the heat treatment process may be performed two or three times to increase crystallinity and purity of the h-BN.

A h-BN sheet obtained as described above may be an atom layer-thick single layer, or a multi-layer structure including two or more layers. The h-BN sheet may have a thickness of, for example, 30 nm or less, 20 nm or less, or 10 nm or less.

The h-BN sheet may be formed to have a large area of 1 $mm_2$ or more by chemical vapor deposition. For example, the h-BN sheet may have an area of about 10 $mm_2$ or more, or about 1 $cm^2$ or more. For example, an area of the h-BN sheet may be in a range of about 1 $mm^2$ to about 10 $m^2$.

Subsequently, the h-BN sheet is surface-treated with fluorine-based gas plasma. This plasma treatment may activate the surface of the h-BN sheet to increase an interfacial adhesive force between the h-BN sheet with at least one of an insulating layer and a graphene sheet Plasma is referred to as a 'fourth material state,' following a solid state, a liquid state, and a gas state, and when a vaporous material is continuously heated, an assembly of particles each consisting of an ion nucleus and a free electron is formed. This state of material is referred to as plasma. The fluorine-based gas plasma is gas plasma that does not damage the surface of a hexagonal boron nitride sheet, and may include, for example, at least one selected from $CF_4$, $CHF_3$, $SF_6$, and $NF_3$. Such fluorine-based compounds have low surface energy and thus have hydrophilic properties and thermal and chemical stability to activate the surface of the h-BN sheet, so that a high-k material is easily deposited thereon.

According to example embodiments, the plasma treatment may be performed by using $CF_4$ gas plasma, and for example, at a flow rate of about 1 to about 10 sccm and at a plasma surface treatment pressure of about 300 to about 700 mTorr for about 1 to about 10 seconds. Due to the treatment, the surface of the h-BN sheet may be sufficiently modified. According to example embodiments, the plasma treatment may be performed by using $CF_4$ gas plasma at a flow rate of about 5 sccm and at a plasma surface treatment pressure of about 460 mTorr for 1 seconds to 5 seconds.

Whether the h-BN sheet is surface modified and characteristics of the h-BN sheet may be confirmed by Fourier transform infrared spectroscopy (FTIR) or Raman spectroscopy.

The h-BN sheet that is surface-modified by plasma treatment is transferred onto a graphene sheet.

A h-BN sheet provided on a catalyst metal or a catalyst metal/substrate may be transferred onto a graphene sheet after the catalyst metal or catalyst metal/substrate is removed by etching At least one of the substrate and the catalyst metal may be removed by, for example, etching with an acid. The acid treatment may be performed by using a hydrochloric acid, a sulfuric acid, a nitric acid, or a mixed solution thereof with a predetermined or given concentration, and the result may be immersed in such acidic solutions for a predetermined or given period of time to remove the catalyst metal, thereby isolating the h-BN sheet. During the removal process with the acid treatment, the h-BN sheet may be coated with a resin, e.g., polymethyl-(metha)acrylate. By doing so, the following transferring process may be easily performed. The coating layer may be removed by using an organic solvent, e.g., acetone.

A graphene sheet on which the surface-treated h-BN sheet is to be transferred, may be a polycyclic aromatic sheet in which a plurality of carbon atoms are connected to each other via a covalent bond (typically, a $sp^2$ bond) and arranged on a plane, or a plurality of the polycyclic aromatic sheets, and the carbon atoms connected via the covalent bond form a 6-membered ring as a repeating unit. However, the carbon atoms may also form a 5-membered and/or 7-membered ring.

The graphene sheet may be a single layer of carbon atoms connected via a covalent bond, and may also be a multi-layer formed by stacking a plurality of such a single layer, and in this case, the formed stack structure may have a nano-size thickness. The graphene sheet may have a thickness of, for example, 30 nm or less, 10 nm or less, or 1 nm or less. A graphene sheet having such thicknesses may be used as a channel layer of an electronic device, e.g., a transistor.

The nano-sized graphene sheet may have a large area. For example, an area of the graphene sheet may be about 1 $mm^2$ or more, for example, about 10 $mm^2$ or more, or about 1 $cm^2$ or more. For example, an area of the graphene sheet may be in a range of about 1 $mm^2$ to about 10 $m^2$.

A large-size graphene sheet may be manufactured by using, for example, a following process.

For example, a graphitization catalyst is formed in the form of a film, and then a heat treatment is performed thereon to form graphene while a vaporous carbon source is supplied thereto, and then, graphene is grown by cooling to form a graphene sheet. That is, when a heat treatment is performed for a predetermined or given period of time while a vaporous carbon source is supplied into a chamber containing a graphitization catalyst at a predetermined or given pressure, carbon components existing in the vaporous carbon source are bonded to each other to form a hexagonal plane structure, thereby forming a graphene sheet.

As a graphitization catalyst that is available for the formation of a graphene sheet, a film-shaped graphitization catalyst may be independently used, and if needed, a graphitization catalyst on the substrate may be used. In particular, when a film-type graphitization catalyst is used, a substrate may be used for convenience of manufacturing processes. Examples of such a substrate are an inorganic substrate, e.g., a Si substrate, a SiC substrate, a glass substrate, a GaN substrate, a silica substrate, or a sapphire substrate, a metal substrate including Ni, Cu or W, and a carbon substrate, e.g., a graphite substrate. The substrate may be coated with a block layer in advance to suppress unnecessary reactions between the substrate and the graphitization catalyst. Due to the presence of the block layer between the substrate and the graphitization catalyst layer, a decrease in production efficiency of a graphene sheet due to a reaction between the graphitization catalyst and the substrate may be suppressed. The block layer may be formed of $SiO_x$, TiN, $Al_2O_3$, $TiO_2$, or $Si_3N_4$, and may be formed on the substrate by, for example, sputtering.

The graphitization catalyst contacts the carbon source so that the graphitization catalyst helps carbon components supplied from the carbon source bonded to each other to form a hexagonal plane structure. For example, a catalyst for synthesizing graphite, a catalyst that induces a hydrocarbon reaction, or a catalyst that is used to prepare a carbon nanotube may be used. In detail, one or more selected from Ni, Co, Fe, Pt, Au, Al, Cr, Cu, Mg, Mn, Mo, Rh, Si, Ta, Ti, W, U, V, and Zr may be used. The graphitization catalyst may have a plane structure formed of metal alone as described above, and the graphitization catalyst may also be fixed on a substrate by deposition or sputtering. The graphitization catalyst may be a thin-film shaped or thick-film shaped graphitization catalyst. When the film-shaped graphitization catalyst is in the form of a thin film, a catalyst formed on a substrate may be used in the procedure of manufacturing.

As a carbon source for use in forming the graphene sheet, any one of various materials that supply carbon and may exist in a vapor phase at a temperature of 300° C. or more may be used without a particular limitation. As a vaporous carbon source, any one of various compounds that contain carbon atoms may be used. For example, a compound containing six carton atoms or less, a compound containing four carton atoms or less, or a compound containing two carton atoms or less may be used. In detail, the vaporous carbon source may be one or more selected from carbon monoxide, ethane, ethylene, ethanol, acetylene, propane, propylene, butane, butadiene, pentane, pentene, cyclopentadiene, hexane, cyclohexane, benzene, and toluene.

The carbon source may be supplied into a chamber containing a graphitization catalyst at a constant pressure, and for example, the carbon source may be supplied at a flow rate of about 1 to about 100 sccm.

In the chamber, only the carbon source may exist, or the carbon source may exist together with inert gas, e.g., helium gas or argon gas. The inert gas may be supplied into a reactor at a flow rate of, for example, about 100 to about 1000 sccm, or about 300 to about 700 sccm.

Also, the carbon source may be used together with a reduction gas, e.g., hydrogen gas. Hydrogen may maintain the surface of a metal catalyst clean to control a vapor reaction. The hydrogen gas may be supplied into a reactor at a flow rate of, for example, about 100 to about 1000 sccm, or about 300 to about 700 sccm.

The carbon source may also be supplied in a mixed gas atmosphere including inert gas and hydrogen gas.

The vaporous carbon source may be supplied into a chamber containing a film-shaped graphitization catalyst, and then, a heat treatment is performed thereon at a predetermined or given temperature, thereby forming graphene on the surface of the graphitization catalyst. A heat treatment temperature may be determined as long as the graphite catalyst is not damaged and graphene grows into a sheet shape. The heat treatment temperature may be in a range of, for example, about 300 to about 2000° C., or about 500 to about 1500° C. When the metal catalyst is in the form of a thick film, the heat treatment temperature may be higher than when the metal catalyst is in the form of a thin film.

The heat treatment may be maintained at a predetermined or given temperature to control a formation degree of graphene. That is, when the heat treatment is maintained for a long period of time, more graphene is formed, and thus a thickness of the resultant graphene sheet may be great. On the other hand, when the heat treatment is maintained for a relatively shorter period of time, a thickness of the resultant graphene sheet may be small. Accordingly, to obtain a graphene sheet having a target thickness, a maintenance time of the heat treatment process may be controlled in addition to control of a carbon source and a supply pressure thereof, a graphitization catalyst, and the size of a chamber. The maintenance time for the heat treatment may be, for example, in a range of about 0.001 to about 1000 hours. Within this time range, graphene may be sufficiently obtained without graphitization.

As a heat source for the heat treatment, induction heating, radiant heat, laser, IR, microwave, plasma, UV, or surface plasmon heating may be used without limitation. Such heat sources may be attached to the chamber to increase the temperature of the inside of the chamber up to a predetermined or given temperature.

After the heat treatment, the heat treatment product undergoes a cooling process. The cooling process may be performed to grow and arrange the generated graphene uniformly. If the cooling process is performed rapidly, the generated graphene sheet may crack. Accordingly, the cooling may be gradually performed at a predetermined or given speed. For example, the cooling may be performed at a rate of about 0.1 to about 10° C. per minute. The cooling may also be a natural cooling. The natural cooling may be performed by simply removing a heat source used for the heat treatment, and the removal of the heat source may be enough to obtain a sufficient cooling speed. The heat treatment process and the cooling process may be performed as one cycle. However, this cycle may be repeatedly performed to form a dense graphene sheet.

A graphene sheet obtained by the cooling process may be a single layer or a multi-layer having a thickness of about 30 nm or less, and may have a large area of about 1 $mm^2$ or more. The area of the graphene sheet may be easily adjusted by, for example, controlling the size of a substrate on which a graphitization catalyst is formed.

Due to the processes, a large-size graphene sheet may be obtained simply at low costs.

On the graphene sheet grown into a large-size, the surface-treated h-BN sheet is transferred, and then, an insulating layer is formed thereon.

As a material for the insulating layer, any one of various materials that have an insulating property and is formed into a thin film may be used, and for example, a high-k dielectric material with a relative dielectric constant of about 7 or more may be used.

The insulating layer may include, for example, a material that has an electric resistance of about 10 $\Omega$cm or more at room temperature, e.g., a metal oxide (including an oxide of silicon), a metal nitride (including a nitride of silicon), a polymer, and an organic low molecular weight molecule. For example, an inorganic oxide thin film with a high relative dielectric constant may be used.

The inorganic oxide may be an silicon oxide, an aluminum oxide, a tantalum oxide, a titanium oxide, a tin oxide, a vanadium oxide, a barium strontium titanate, a barium zirconate titanate, a lead zirconate titanate, a lead lantanium titanate, a strontium titanate, a barium titanate, a barium magnesium fluoride, a lanthanum oxide, a fluorine oxide, a magnesium oxide, a bismuth oxide, a bismuth titanate, a niobium oxide, a strontium bismuth titanate, a strontium bismuth tantalate, a tantalum pentoxide, a bismuth tantalite niobumate, a yttrium oxide, or a combination thereof. For example, the inorganic oxide is a silicon oxide, an aluminum oxide, a tantalum oxide, or a titanium oxide.

Also, an inorganic nitride, e.g., a silicon nitride ($Si_3N_4$, $Si_xN_y$ (x>0, y>0)) or an aluminum nitride, may be appropriately used.

Also, the insulating layer may be formed by using a precursor material including an alkoxide metal. For example, a solution of the precursor material is coated on a substrate, and then subjected to a chemical solution treatment including a heat treatment, thereby forming an insulating layer.

Metal of the alkoxide metal may be, for example, selected from transition metal, lanthanoid, or representative elements, and in detail, may be barium (Ba), strontium (Sr), titanium (Ti), bismuth (Bi), tantalum (Ta), zirconium (Zr), iron (Fe), nickel (Ni), manganese (Mn), lead (Pb), lantanium (La), lithium (Li), sodium (Na), potassium (K), rubidium (Rb), cesium (Cs), francium (Fr), barium (Be), magnesium (Mg), calcium (Ca), niobium (Nb), thallium (Tl), mercury (Hg), copper (Cu), cobalt (Co), rhodium (Rh), scandium (Sc), or yttrium (Y). Also, alkoxide of the alkoxide metal may be, for example, a material induced from alcohols, e.g., methanol, ethanol, propanol, isopropanol, butanol, or isobutanol, and alkoxy alcohols, e.g., methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol, or heptoxy propanol.

An organic compound for use in forming the insulating layer may be polyimide, polyamide, polyester, polyacrylate, photoradical polymerization system, a photosetting resin of a photo cation polymerization system, an acrylonitrile-containing copolymer, polyvinylphenol, polyvinylalcohol, a novolac resin, or a cyanoethylfullurene.

Also, wax, polyethylene, polychloropyrene, polyethyleneterephthalate, polyoxymethylene, polyvinylchloride, polyvinylidene fluoride, polymethylmethacrylate, polysulfone, polycarbonate, polyimidcyanoethyl fullerene, poly(vinylphenol)(PVP), poly(methylmethacrylate)(PMMA), polycarbonate (PC), polystyrene (PS), polyolefin, polyacrylamide, poly(acrylate), novolac resin, resol resin, polyimide, polyxylene, epoxy resin, and fullerene that is a polymer with a high dielectric constant may be used.

The insulating layer may be a mixed layer formed of a plurality of such inorganic or organic compounds, or may be a laminated structure thereof. In this regard, according to purpose, a material with a high dielectric constant and a material with water repellent properties may be mixed or stacked to control performance of a device.

The insulating layer may be formed by a dry process, e.g., atomic layer deposition, vacuum deposition, molecular-ray epitaxial growth, ion cluster beaming, low-energy ion-beaming, ion plating, chemical vapor deposition (CVD), sputtering, or atmospheric plasma method; a coating method, e.g., spray-coating, spin coating, blade coating, dip coating, casting, roll coating, bar coating, or die coating; or a wet process, e.g., patterning, printing or ink-jetting, and these methods may be appropriately used according to a material for forming the insulating material. As a wet process, a sol-gel method may be used in which inorganic oxide particles are dispersed in an organic solvent or water, and optionally, a dispersion assistant, e.g., a surfactant, and the obtained dispersion is coated and dried; or an oxide precursor, for example, a solution of alkoxide is coated and dried.

According to the method of example embodiments, a h-BN sheet is formed as a buffer layer (or sacrificial layer) on a graphene sheet, so that an insulating layer including a high-k dielectric material is easily deposited thereon without any damage to the graphene sheet. A graphene laminated structure including the undamaged graphene sheet may be variously used in an electronic device, e.g., a transistor.

A graphene laminated structure according to example embodiments may include a channel layer that includes a graphene sheet and is formed on a substrate; a buffer layer that includes a hexagonal boron nitride sheet and is formed on the channel layer to protect the graphene sheet; and an insulating layer formed on the buffer layer.

The substrate may be, for example, an inorganic substrate, e.g., a Si substrate, a SiC substrate, a glass substrate, a GaN substrate, a silica substrate, or a sapphire substrate, a metal, e.g., Ni, Cu, or W, substrate, and a carbon substrate, e.g., a graphite substrate.

The graphene sheet is either a single layer of a polycyclic aromatic sheet in which a plurality of carbon atoms are connected to each other via a covalent bond and arranged on a plane or a multi-layer formed by stacking a plurality of the polycyclic aromatic sheet, and has a thickness of about 30 nm or less.

The nano-sized graphene sheet may have a large area. For example, an area of the graphene sheet may be about 1 $mm^2$ or more, for example, about 10 $mm^2$ or more, or about 1 $cm^2$ or more. For example, an area of the graphene sheet may be in a range of about 1 $mm^2$ to about 10 $m^2$.

The buffer layer is used as a sacrificial layer to form a high-quality insulating layer on a graphene sheet without damage on the graphene sheet. The buffer layer includes a hexagonal boron nitride (h-BN) sheet, and the h-BN sheet has a two-dimensional planar structure in which a B—N bond is a $sp^2$ covalent bond and an interlayer bond is a Van Der Waals bond, and has a thickness of about 10 nm or less.

A material for forming the insulating layer may be a material that has electric insulating properties, for example, a high-k dielectric material with a high relative dielectric constant. The insulating layer may include, for example, a material that has an electric resistance of about 10 $\Omega$cm or more at room temperature, e.g., a metal oxide (including an oxide of silicon), a metal nitride (including a nitride of silicon), a polymer, and an organic low molecular weight molecule. For example, an inorganic oxide thin film with a high relative dielectric constant may be used. Related description is already presented above.

An electronic device including the graphene laminated structure according to example embodiments is provided. A laminated structure including the graphene laminated structure using the h-BN sheet as a buffer layer and an insulating layer may be used in various electronic devices, and for example, may be used in a sensor, a bipolar junction transistor, an field effect transistor, a hetero junction bipolar transistor, a single electron transistor, a light-emitting diode, or an organic electric field light-emitting diode.

An example of the field effect transistor FET is illustrated in FIG. 1. Referring to FIG. 1, a silica substrate 312 is disposed on a substrate 311, and a channel layer 313 is disposed thereon. The channel layer 313 may be a graphene channel layer including a graphene sheet. To protect the graphene sheet, a buffer layer 318 including a hexagonal boron nitride sheet may be formed on the channel layer 313. A source electrode 314 and a drain electrode 316 are respectively disposed on left and right sides of the channel layer 313 and the buffer layer 318, and a gate electrode 315 is disposed on the resultant structure with an insulating layer 317 therebetween. In this regard, a current flowing between the source and drain electrodes 314 and 316 is controlled by applying a voltage to the gate electrode 315. That is, on and off operations of the FET are performed such that the graphene channel layer 313 constitutes a channel region, and a current flowing between the source and drain electrodes 314 and 316 is controlled by applying a voltage to the gate electrode 315. In the field effect transistor, an insulating layer 317 may include a high-k dielectric material with a high relative dielectric constant. An example of the high-k dielectric material is a material that has an electric resistance of about 10 $\Omega$cm or more at room temperature, e.g., a metal oxide (including an oxide of silicon) or a metal nitride (including a nitride of silicon, a polymer, or an organic low molecular weight molecule. For example, an inorganic oxide thin film with a high relative dielectric constant may be used.

Hereinafter, example embodiments are described in detail. However, the example embodiments do not limit the scope of the inventive concepts.

Example 1

Manufacturing of Graphene Laminated Structure

Formation of h-BN Sheet

Copper foil with a size of 2 cm×10 cm and a thickness of 175 μm was washed with diluted fluoric acid and deionized water. Copper foil was located into a CVD chamber, and then gradually heated by inductive heating up to 1000° C. for 2 hours while a mixed gas of $Ar/H_2$ (20 vol % $H_2$ and 80 vol % Ar) and $N_2$ gas each at a flow rate of 500 sccm. After the heat treatment, the copper foil was subjected to chemical polishing by using a copper etchant (Type 1, manufactured by Transene Company, Inc.) dilution to planarize the surface of the copper foil.

Copper foil was located into a CVD chamber, and then gradually heated by inductive heating up to 1000° C. for 2 hours while a mixed gas of $Ar/H_2$ (20 vol % $H_2$ and 80 vol % Ar) at a flow rate of 100 sccm.

Subsequently, ammonia boran ($NH_3$—$BH_3$) as a source material was supplied into a separate heating chamber and then sublimated at a temperature of 110 to 130° C. together with nitrogen gas supplied at a flow rate of 25 sccm. The result was supplied into the CVD chamber to grow h-BN for 30 minutes. During the growth of the h-BN, $Ar/H_2$ mixed gas was supplied into the CVD chamber at a temperature of 1,000° C. at a flow rate of 75 sccm.

After the growth process for h-BN, a heat source was removed therefrom, and then, a cooling process was performed thereon until down to 60° C. while Ar/H2 mixed gas was supplied into the CVD chamber at a flow rate of 100 sccm for 4 hours to form a h-BN sheet on the copper foil.

$CH_4$ Plasma Treatment

The surface of h-BN sheet formed on the copper foil was plasma-treated with $CH_4$ gas as described below.

For the $CH_4$ plasma treatment, a mini cube plasma equipment of ALLFORSYSTEM in which $N_2$ (99.999%) and $CF_4$ (99.999%) gas were connected to a cylindrical vacuum chamber (a diameter of 10 cm, and a height of 10 cm) was used. The h-BN sheet formed on the copper foil was located inside the cylindrical vacuum chamber, and then surface-treated at 450 mTorr for 5 seconds.

Etching and Transferring Processes

The h-BN sheet formed on the copper foil was immersed in a copper etchant (Transene, type1) to remove the copper foil therefrom. After the removal of copper, the h-BN sheet was washed a few times with deionized water to completely remove the residual etchant.

Also, a graphene sheet was prepared by using the following graphene growth method. First, a copper foil with the size of 8 cm×15 cm and the thickness of 75 μm was washed with diluted hydrofluoric acid and deionized water, and then, the copper foil was placed into a CVD chamber, and then, gradually heated by inductive heating for 1.5 hours up to a temperature of 1000° C. while $H_2$ gas was supplied thereto at a flow rate of 10 sccm. After the copper foil was heated for 30 minutes, graphene was grown by inductive heating for 30 minutes while $CH_4$ gas was supplied thereto at a flow rate of 20 sccm. After the growth, the supply of $CH_4$ was stopped, and then a rapid cooling process was performed thereon to room temperature in $H_2$ atmosphere. A completely grown graphene sheet was coated with PMMA and then immersed in a copper etchant to remove the copper foil therefrom. After the removal of copper, the graphene sheet was transferred onto a silicon substrate, and then, PMMA was removed therefrom by using acetone.

The h-BN sheet was transferred onto the graphene sheet prepared described above

Deposition of $Al_2O_3$ Insulating Layer

An $Al_2O_3$ insulating layer having a thickness of 10 nm was formed from trimethylaluminum (TMA; $Al(CH_3)_3$) that was a precursor material on the h-BN sheet transferred onto the graphene sheet at a temperature of 300° C. by atomic layer deposition, thereby completing manufacturing of a graphene laminated structure.

Comparative Example 1

A graphene laminated structure was manufactured in the same manner as in Example 1, except that the $CH_4$ plasma treatment was not performed.

Comparative Example 2

A graphene laminated structure was manufactured in the same manner as in Example 1, except that an $Al_2O_3$ insulating layer was directly deposited on the graphene sheet without the h-BN sheet.

Evaluation Example 1

Confirmation of h-BN Sheet Before and after Surface Treatment

Figure 2:
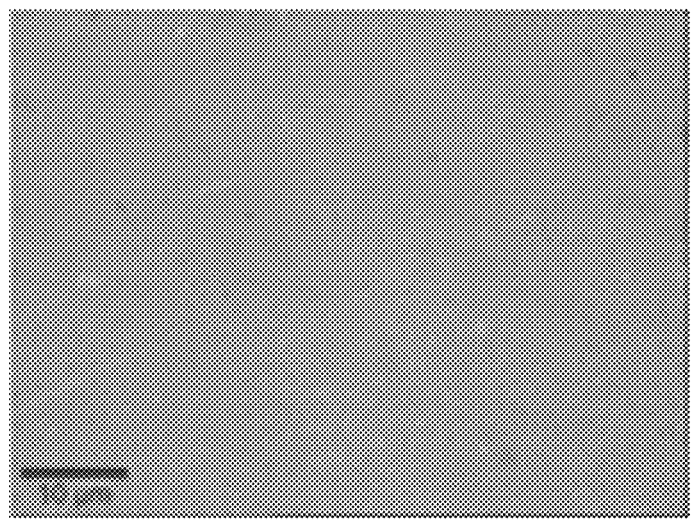
FIGS. 2 and 3 are optical microscopic (OM) images showing a h-BN sheet prepared according to Example 1 before and after $CH_4$ plasma treatment.
Figure 3:
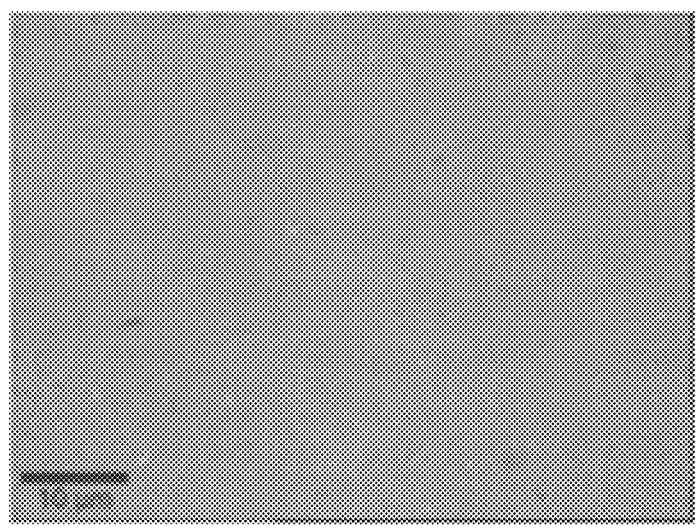

To confirm the h-BN sheet prepared according to Example 1 before and after the $CH_4$ plasma treatment, the pristine h-BN sheet and the post-$CH_4$ plasma treatment h-BN sheet were analyzed by using optical microscope (OM), Raman spectrum, and FTIR FIGS. 2 and 3 respectively show picture of the h-BN sheet before and after the surface treatment. Referring to FIGS. 2 and 3, it was confirmed that the h-BN sheet exists before and after the plasma treatment.

Figure 4:
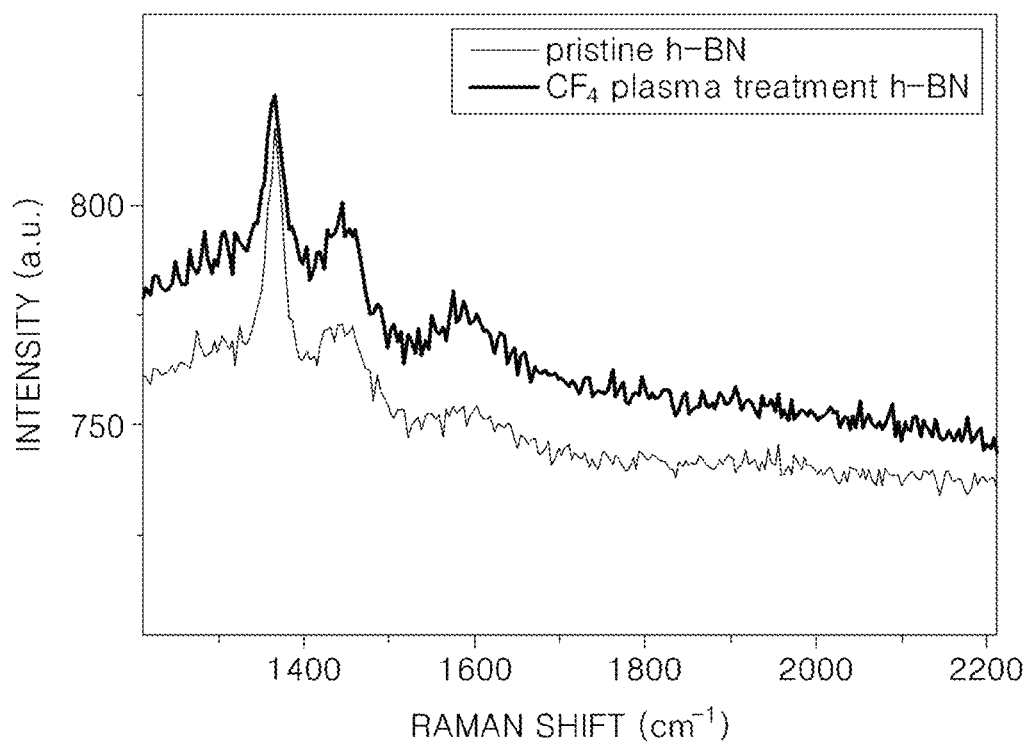
FIG. 4 shows a Raman spectrum of a h-BN sheet prepared according to Example 1.

FIG. 4 shows Raman spectrum of the h-BN sheet before and after the surface treatment. Referring to the Raman data shown in FIG. 4, although a peak intensity of the h-BN reduces after the $CF_4$ plasma treatment, characteristics of h-BN was still shown, that is, a main peak appeared at 1370 $cm^{-1}$.

Figure 5A:
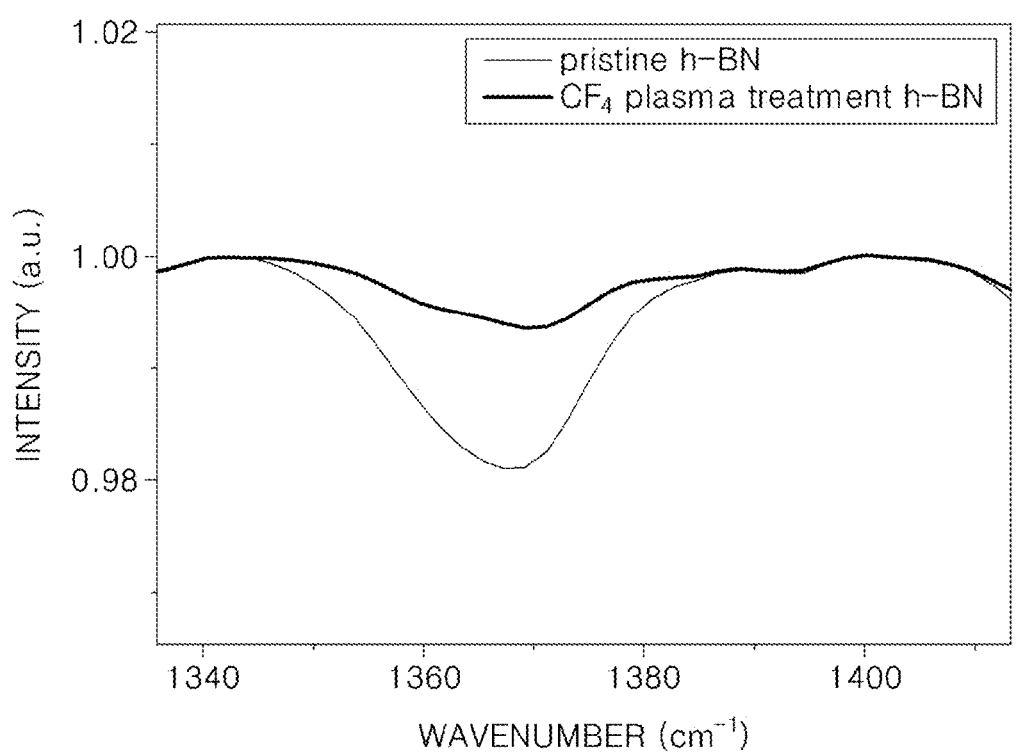
FIGS. 5A and 5B show Fourier transform infrared spectroscopy (FTIR) data of an h-BN sheet prepared according to Example 1 before and after the surface treatment.
Figure 5B:
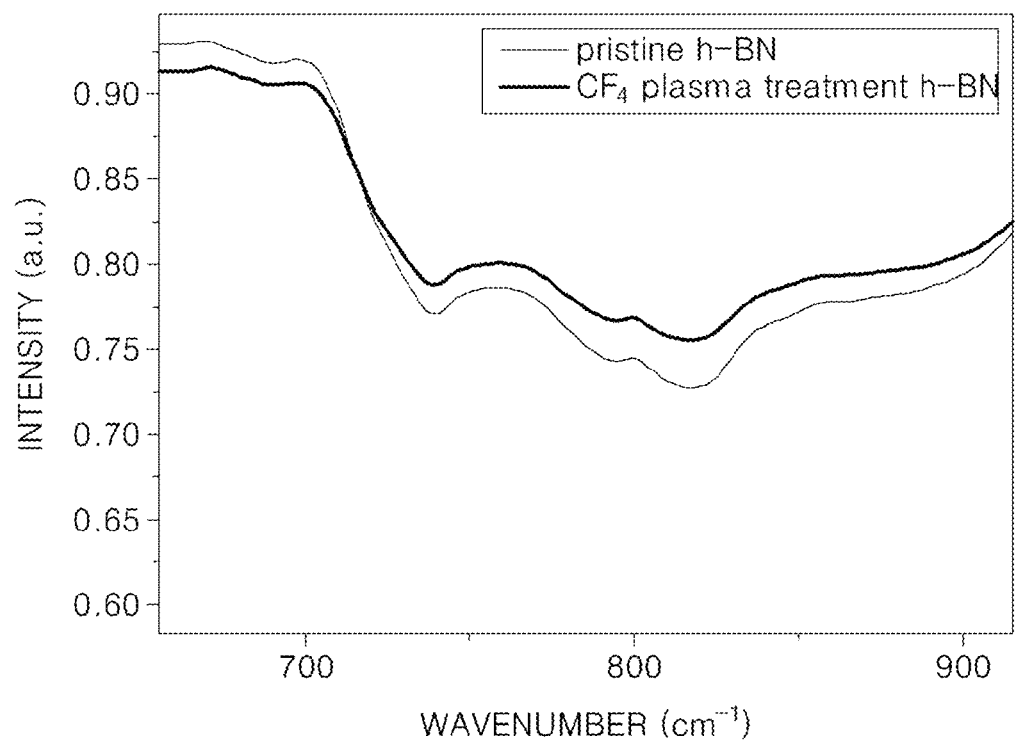

FIGS. 5A and 5B show the FTIR data of the h-BN sheet before and after the surface treatment. FIG. 5A shows data of an in-plane vibration region showing a stretching vibration mode of boron and nitrogen of the h-BN, and FIG. 5B shows data of an out-of-plane vibration region showing a B—N—B bending vibration mode, As shown in FIGS. 5A and 5B, compared to pristine h-BN, a peak intensity reduced in the stretching vibration mode of boron and nitrogen of the h-BN that was subjected to the $CF_4$ plasma treatment. However, in the out-of-plane vibration region showing a B—N—B bending vibration mode, a change in peak intensity did not occur.

This result shows that the plasma treatment leads to a change in original interfacial characteristics of h-BN and due to the surface modification, an oxide of a high-k dielectric material is easily deposited.

Evaluation Example 2

XPS Analysis of Graphene Laminated Structure

Whether the graphene laminated structures manufactured according to Comparative Examples 1 and 2 and Example 1 included an Al$_2$O$_3$ insulating layer was analyzed by using an X-ray photoelectron spectroscopy (XPS), and results thereof are shown in FIGS. 6A to 8B.

Figure 6A:
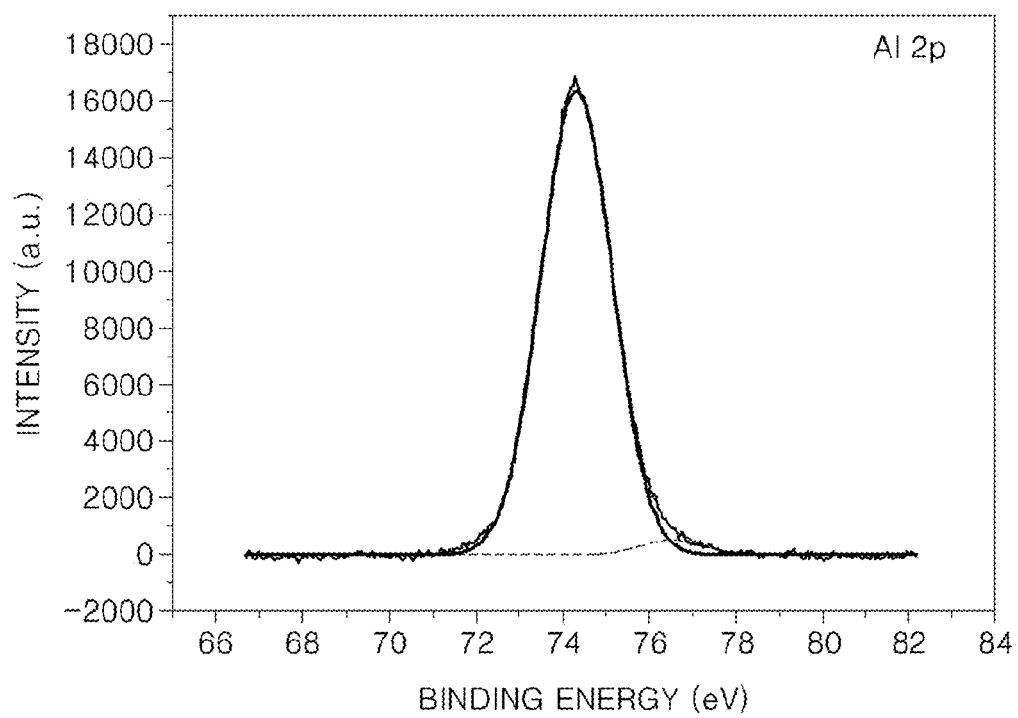
FIGS. 6A and 6B show X-ray photo electron spectroscopy (XPS) measurement results of Comparative Example 2 in which the h-BN sheet is not formed.
Figure 6B:
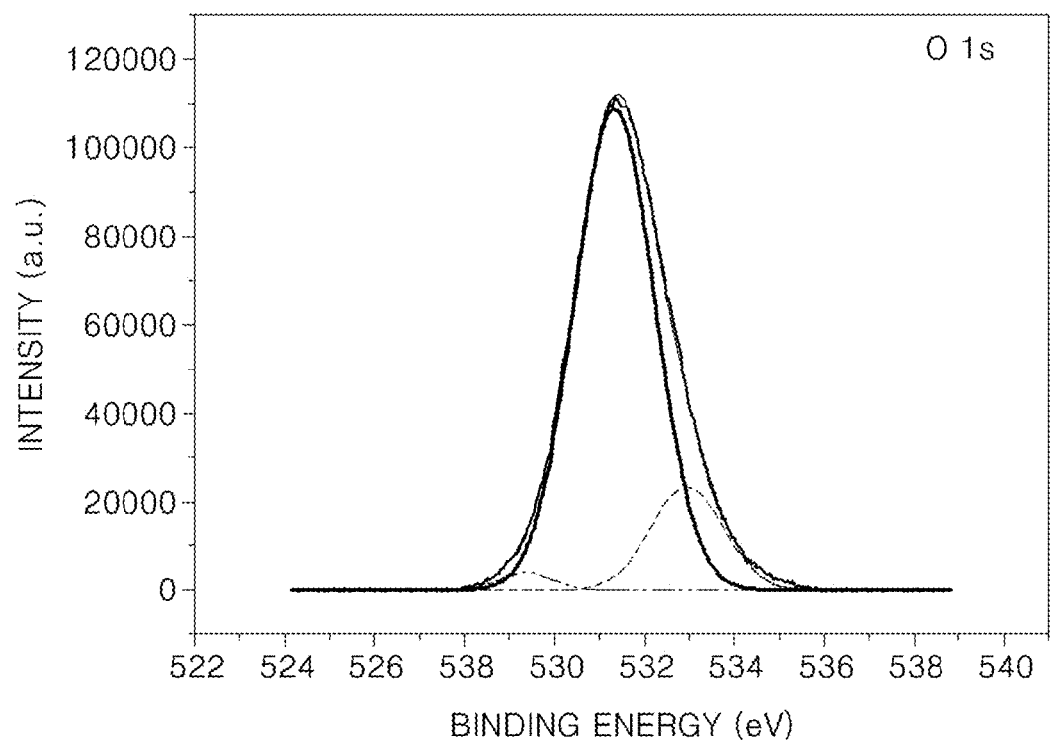

FIGS. 6A and 6B show XPS measurement results of Comparative Example 2 in which the h-BN sheet was not formed. Referring to FIGS. 6A and 6B, when Al$_2$O$_3$ was directly deposited on a graphene sheet by ALD, Al(OH)$_3$/AlO(OH) was deposited instead of Al$_2$O$_3$.

Figure 7A:
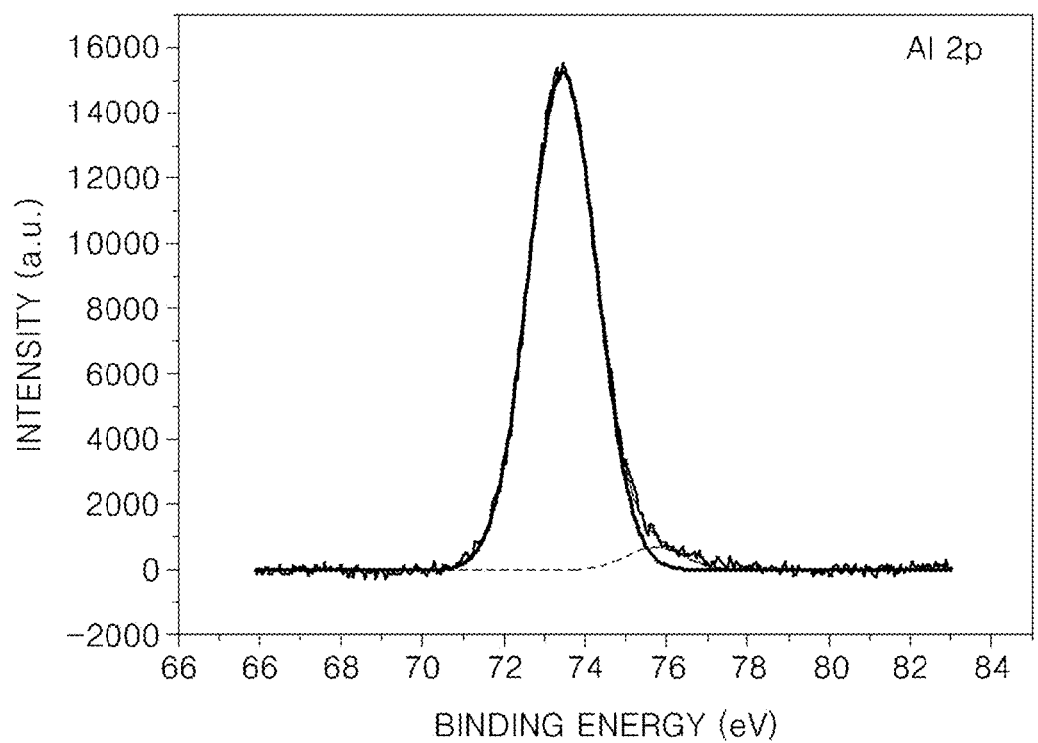
FIGS. 7A and 7B shows XPS measurement results of Comparative Example 1 in which $Al_2O_3$ is deposited on an h-BN sheet without CF4 plasma.
Figure 7B:
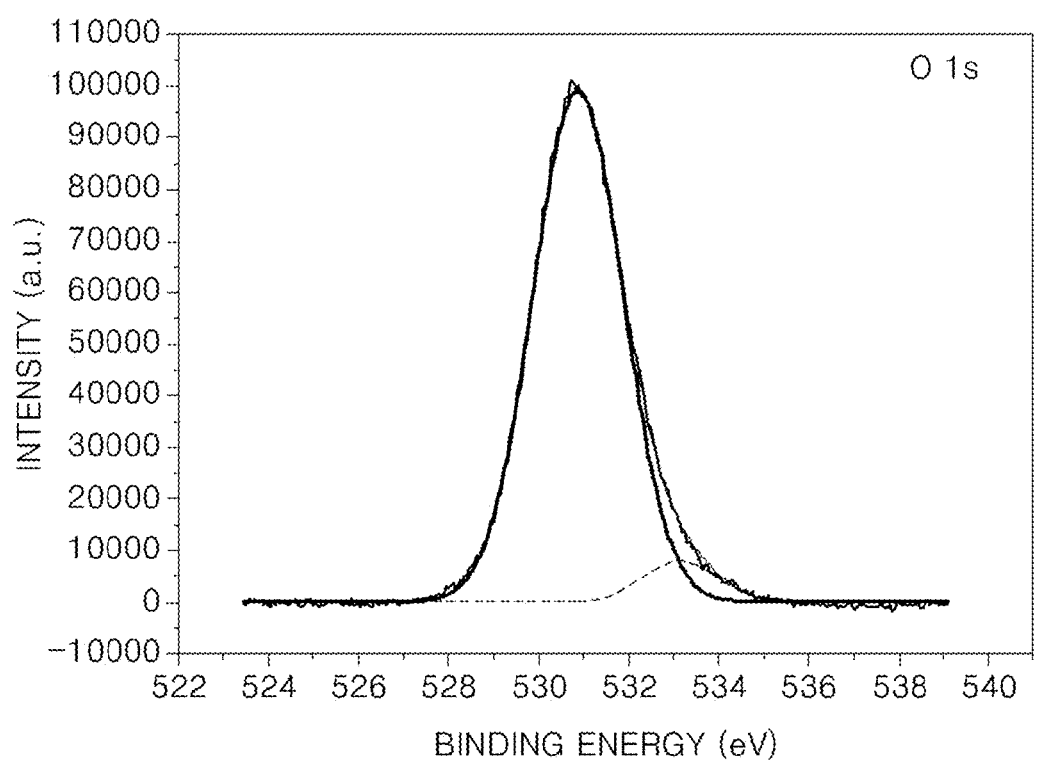
Figure 8A:
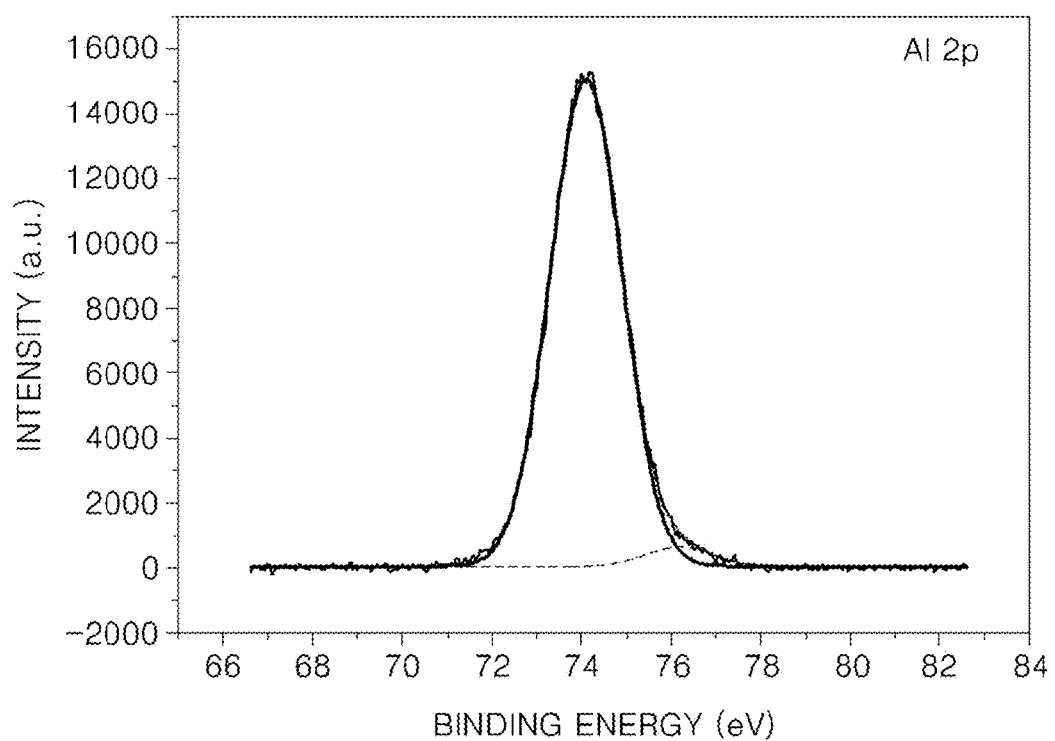
FIGS. 8A and 8B shows XPS measurement results of Example 1 in which $Al_2O_3$ is deposited on an h-BN sheet with $CF_4$ plasma.
Figure 8B:
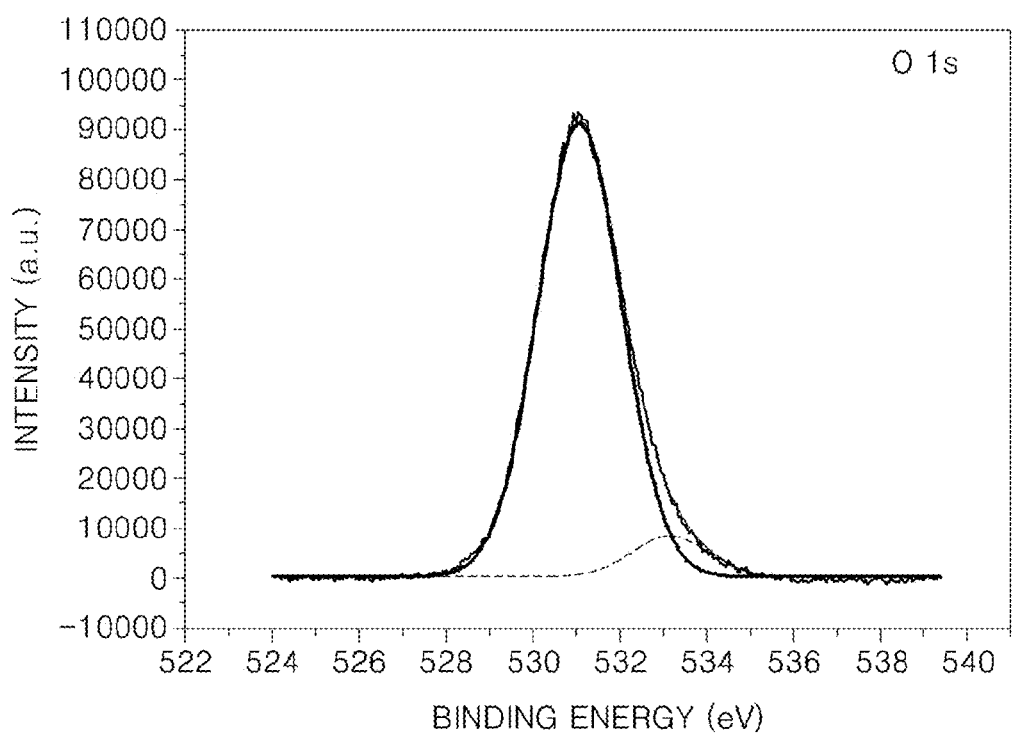

FIGS. 7A and 7B shows XPS measurement results of Comparative Example 1 in which Al$_2$O$_3$ was deposited on the h-BN sheet without CF$_4$ plasma treatment, and FIGS. 8A and 8B shows XPS measurement results of Example 1 in which Al$_2$O$_3$ was deposited on the h-BN sheet with CF$_4$ plasma treatment.

Referring to FIGS. 7A to 8B, when Al$_2$O$_3$ was deposited on the h-BN sheet by ALD, regardless of the plasma treatment, Al$_2$O$_3$ was deposited although Al$_2$O$_3$ phase was slightly different from each other.

Evaluation Example 3

Electrostatic Capacity Measurement of h-BN Sheet and Al$_2$O$_3$ Insulating Layer To confirm insulating characteristics of the h-BN sheet and the Al$_2$O$_3$ insulating layer used in Example 1 and Comparative Example 1, first, as a reference, a silver electrode having a size of 1 mm×1 mm and a thickness of 100 nm was deposited by using a thermal evaporator on a p-type Si substrate on which a SiO$_2$ layer having a thickness of 300 nm was deposited to manufacture a comparative test device.

Separately, the CF$_4$ plasma-treated h-BN sheet and the Al$_2$O$_3$ insulating layer which were used in Example 1 were deposited on a p-type Si substrate on which a SiO$_2$ layer having a thickness of 300 nm was deposited, and then, a silver electrode having a size of 1 mm×1 mm and a thickness of 100 nm was deposited thereon by using a thermal evaporator, thereby completing manufacturing a test device. Likewise, the h-BN sheet that was not surface-treated and the Al$_2$O$_3$ insulating layer which were used in Comparative Example 1 were deposited on a p-type Si substrate on which a SiO$_2$ layer having a thickness of 300 nm was deposited, and then, a silver electrode having a size of 1 mm×1 mm and a thickness of 100 nm was deposited thereon by using a thermal evaporator, thereby completing manufacturing a test device.

Figure 9:
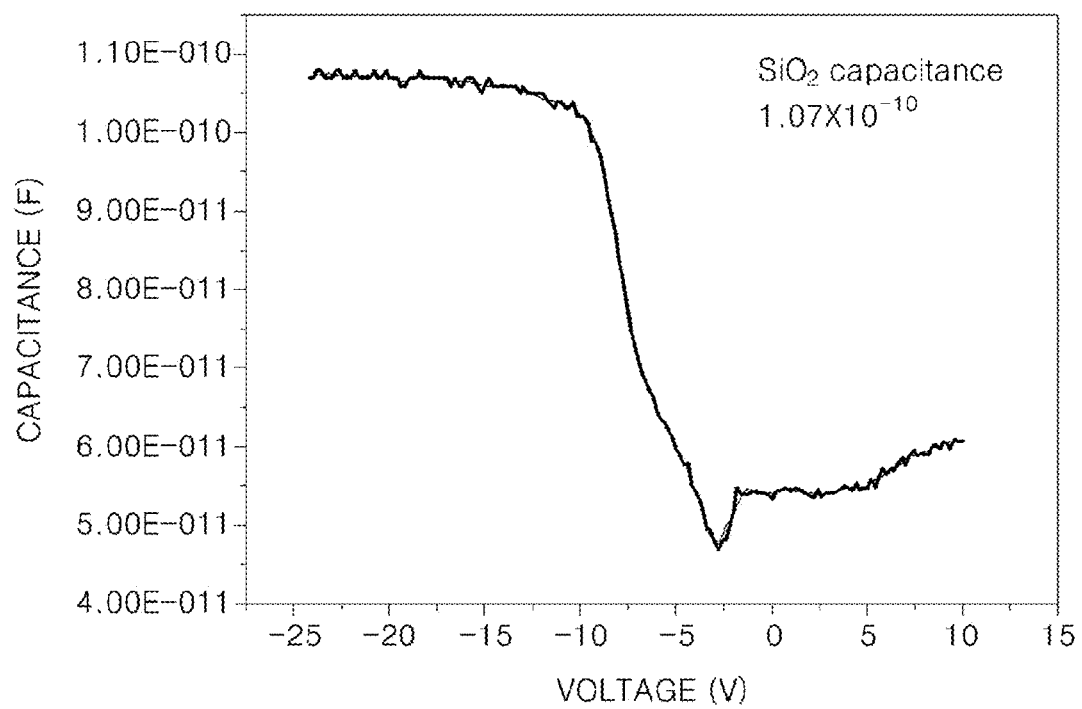
FIG. 9 shows electrostatic capacity measurement results of 300 nm $SiO_2$.
Figure 10:
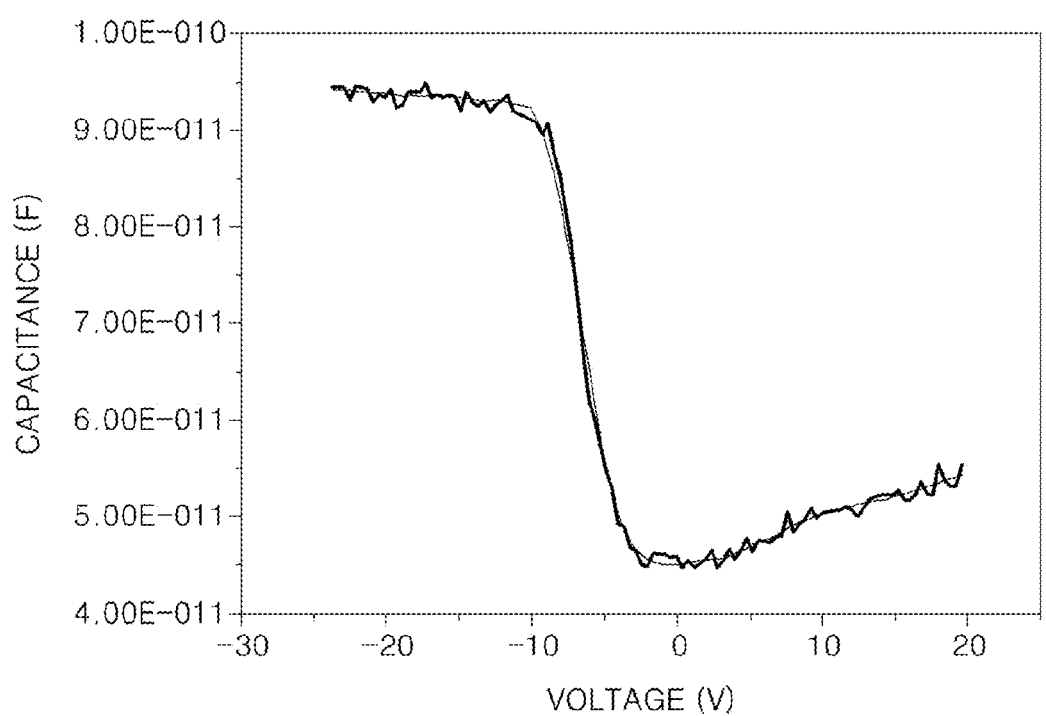
FIG. 10 shows electrostatic capacity measurement results of h-BN/$Al_2O_3$ treated with $SiO_2$/$CF_4$ plasma.
Figure 11:
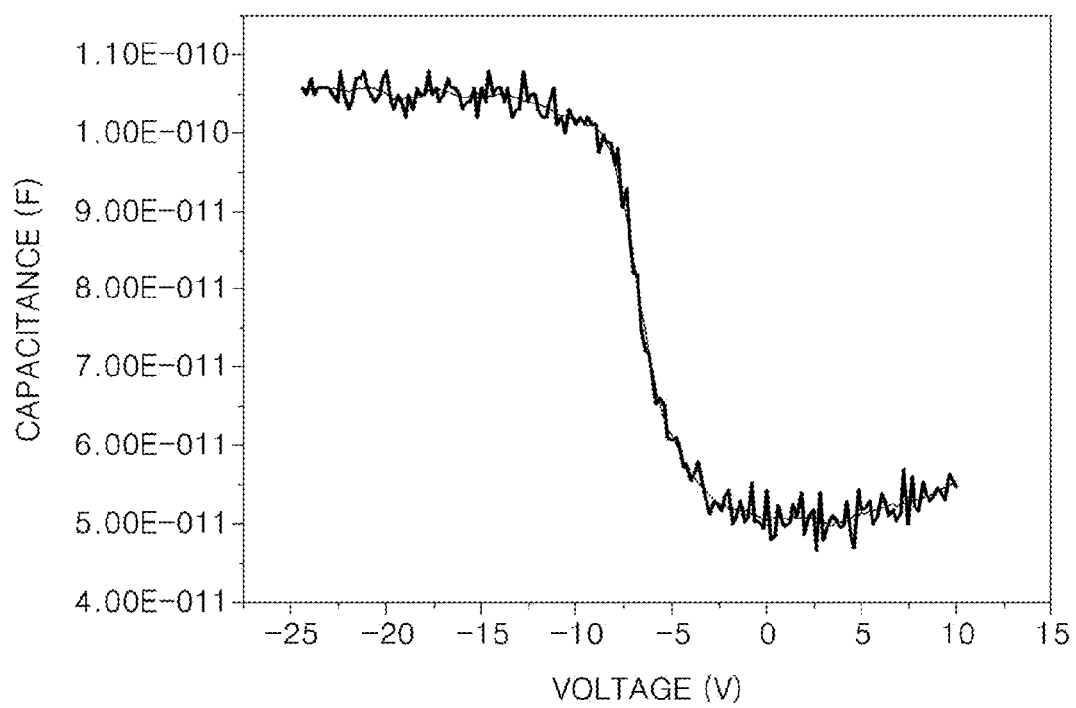
FIG. 11 shows electrostatic capacity measurement results of h-BN/$Al_2O_3$ when $SiO_2$ was used and the surface treatment was not performed.

Bottom surfaces of the respective comparative test device and test devices were connected to a copper plate by using a silver paste, and then, the silver electrodes and the copper plate were respectively connected to a LCR meter to measure an electrostatic capacity according to a voltage change, and results thereof are shown in FIGS. 9 to 11.

Referring to FIGS. 9 to 11, when 300 nm SiO$_2$ was used, the obtained electrostatic capacity was $1.07 \times 10^{-10}$ F/cm$_2$, and when h-BN/Al$_2$O$_3$ plasma-treated with SiO$_2$/CF$_4$ was used, the obtained electrostatic capacity was $1.43 \times 10^{-9}$ F/cm$^2$, when SiO$_2$ was used, the obtained electrostatic capacity was $1.04 \times 10^{-8}$ F/cm$^2$, and when SiO$_2$ was used and the surface treatment was not performed, the obtained electrostatic capacity of the h-BN/Al$_2$O$_3$ was $5.6 \times 10^{-9}$ F/cm$^2$. From such results, compared to SiO$_2$, it was confirmed that the electrostatic capacity of the h-BN sheet and the Al$_2$O$_3$ insulating layer used in Example 1 and Comparative Example 1 improved. Such result shows that the h-BN sheet acts as an insulating layer regardless of the surface treatment.

According to methods of manufacturing graphene laminated structures as described above, a hexagonal boron nitride sheet that is surface-treated with fluorine-based gas plasma may be interposed between a graphene sheet and a dielectric, e.g., high-k, insulating layer, so that a dielectric, e.g., high-k, insulating layer may be deposited on graphene without any damage on the surface of graphene.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a graphene laminated structure, the method comprising:
    plasma-treating a surface of a hexagonal boron nitride sheet using a fluorine-based gas plasma;
    depositing the hexagonal boron nitride sheet on a graphene sheet; and
    forming an insulating layer on a surface of the surface-treated hexagonal boron nitride sheet.

2. The method of claim 1, wherein the plasma-treating includes using at least one gas selected from CF$_4$, CHF$_3$, SF$_6$, and NF$_3$.

3. The method of claim 1, wherein the plasma-treating is performed at a flow rate of about 1 to about 10 sccm and at a plasma surface treatment pressure of about 300 to about 700 mTorr for about 1 to about 10 seconds.

4. The method of claim 1, wherein
    the hexagonal boron nitride sheet has a two-dimensional planar structure including a B—N bond that is a sp$^2$ covalent bond and an interlayer bond that is a Van Der Waals bond, and
    the hexagonal boron nitride sheet has a thickness of 10 nm or less.

5. The method of claim 1, wherein the plasma-treating includes plasma-treating the surface of the hexagonal boron nitride sheet having an area of about 1 cm$^2$ or more.

6. The method of claim 1, further comprising:
    providing the hexagonal boron nitride sheet on a metal catalyst thin film before the plasma-treating.

7. The method of claim 6, further comprising:
    removing the metal catalyst thin film from the hexagonal boron nitride sheet by etching after the plasma-treating.

8. The method of claim 1, wherein
    the graphene sheet is one of a single layer of a polycyclic aromatic sheet including a plurality of carbon atoms connected to each other via a covalent bond and arranged on a plane, and a multi-layer formed by stacking a plurality of the polycyclic aromatic sheets, and
    the graphene sheet has a thickness of about 30 nm or less.

9. The method of claim 1, wherein the depositing deposits the hexagonal boron nitride sheet on the graphene sheet having an area of about 1 cm$^2$ or more.

10. The method of claim 1, further comprising:
    providing the graphene sheet on at least one substrate before the depositing, the substrate including at least one of a Si substrate, a SiC substrate, a glass substrate, a GaN substrate, a silica substrate, a sapphire substrate, a metal substrate, and a carbon substrate.

11. The method of claim 1, wherein the forming an insulating layer forms a high-k dielectric material having a dielectric constant of 7 or more.

12. The method of claim 1, wherein the forming an insulating layer includes forming at least one of a metal oxide, a metal nitride, a polymer, and an organic molecule.

13. The method of claim 12, wherein the forming an insulating layer includes forming the metal oxide, the metal oxide including at least one of a silicon oxide, an aluminum oxide, a tantalum oxide, a titanium oxide, a tin oxide, a vanadium oxide, a bariumstrontium titanate, a barium zirconate titanate, a lead zirconate titanate, a lead lantanium titanate, a strontium titanate, a barium titanate, a barium magnesium fluoride, a lantanium oxide, a fluorine oxide, a magnesium oxide, a bismuth oxide, a bismuth titanate, a niobium oxide, a strontium bismuth titanate, a strontium bismuth tantalate, a tantalum pentoxide, a bismuth tantalite niobumate, and a yttrium oxide.

14. The method of claim 1, wherein the forming an insulating layer includes at least one of atomic layer deposition, vacuum deposition, molecular-ray epitaxial growth, ion cluster beaming, low-energy ion-beaming, ion plating, chemical vapor deposition (CVD), sputtering, atmospheric plasma method, spray-coating, spin coating, blade coating, dip coating, casting, roll coating, bar coating, and die coating.

* * * * *